United States Patent [19]

Clark

[11] 4,125,415
[45] Nov. 14, 1978

[54] METHOD OF MAKING HIGH VOLTAGE SEMICONDUCTOR STRUCTURE

[75] Inventor: Lowell E. Clark, Scottsdale, Ariz.

[73] Assignee: Motorola, Inc., Schaumburg, Ill.

[21] Appl. No.: 795,257

[22] Filed: May 9, 1977

Related U.S. Application Data

[62] Division of Ser. No. 642,940, Dec. 22, 1975, abandoned.

[51] Int. Cl.² .................. H01L 21/22; H01L 7/54; H01L 21/265
[52] U.S. Cl. ..................... 148/1.5; 357/20; 357/48; 357/91
[58] Field of Search ............... 357/47, 48, 20, 91; 148/1.5

[56] References Cited

U.S. PATENT DOCUMENTS

| | | | |
|---|---|---|---|
| 3,515,956 | 6/1970 | Martin | 317/234 |
| 3,653,978 | 4/1972 | Robinson | 148/1.5 |
| 3,909,119 | 9/1975 | Wolley | 357/13 |
| 3,914,781 | 10/1975 | Matsushita et al. | 357/38 |
| 3,920,493 | 11/1975 | Kravitz | 148/187 |

*Primary Examiner*—L. Dewayne Rutledge
*Assistant Examiner*—Upendra Roy
*Attorney, Agent, or Firm*—Lowell E. Clark

[57] ABSTRACT

A semiconductor p-n junction structure with improved blocking voltage capability. The improvement results from the addition of a doped layer with limited total doping to the main p-n junction. Such a structure is suitable for diodes, transistors, thyristors and the like.

4 Claims, 4 Drawing Figures

METHOD OF MAKING HIGH VOLTAGE SEMICONDUCTOR STRUCTURE

This is a division, of application Ser. No. 642,940, filed Dec. 22, 1975, abandoned.

SUMMARY OF THE INVENTION

High voltage p-n junction semiconductor devices are conventionally formed by the diffusion of one conductivity-type determining element into a lightly-doped semiconductor body of opposite conductivity type. Typically, the body has a much larger area than required for each individual rectifying element, so that the latter are formed by etching and/or breaking the body into the smaller elements. The active area may be defined by such etching/breaking steps (generally called the mesa process) or by limiting the area of the junction determining diffusion by masking (generally called the oxide-masked process). Both of these methods have severe limitations vis-a-vis the high voltage capability of the junctions produced. In the mesa process, the voltage is sensitive to the angle at which the edge of the mesa intersects the junction, generally dictating that the structure be etched from one specific side of the junction. The exposed p-n junction must be covered with some passivant in order to minimize the drift of the breakdown voltage and junction leakage. Such passivation must ordinarily be applied subsequent to device separation, which means individual rather than batch processing. In the oxide-masked technique, junction curvature at the edges of the mask is such that breakdown voltage is reduced over the capability set by the body resistivity. Thermal oxide is ordinarily used as a mask in silicon devices; this oxide is unsuited for high-voltage device production because it has high fixed charge density, high permeability for charged ions which adversely affect the breakdown voltage, and its thinness makes the breakdown voltage very sensitive to charges on the surface of the oxide, so that a further passivating coating is often required.

In both the device forming techniques described above, the voltage-capabilities of the fabricated device are limited by the conditions at or near the surface termination of the p-n junction. In the present invention, such surface effects are mitigated by the use of a lightly doped auxiliary region adjacent the main p-n junction. This auxiliary region contains a limited amount of doping, so that it fully depletes at a voltage significantly below the breakdown voltage of the main junction.

The invention will be more completely described in conjunction with the figures.

Figure 1:
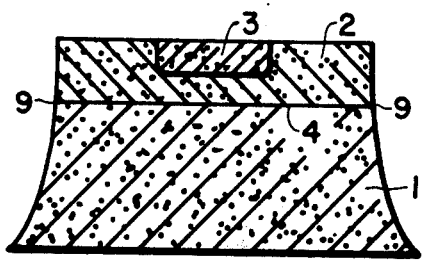
FIG. 1 is a cross-sectional view of a high voltage semiconductor structure.

FIG. 1 is a cross-sectional view of a high voltage semiconductor device representative of the mesa process. The semiconductor might be silicon, germanium or certain compounds. The N-type body 1 is of sufficiently high resistivity that its junction 4 with the P+ region 2 has inherently high voltage breakdown. The P+ — N junction 4 is terminated at the sides by an etching and/or mechanical shaping process in order to separate the individual devices and to configure the surface region of the P+ — N junction 4. In the embodiment shown the N-region increases in cross-sectional area away from the junction, leading to a reduction in breakdown voltage of the whole device below the capability of the interior region of the P+ — N junction. The surface angles could be reversed by shaping from the back or bottom, so that the N-region decreases in area away from the P+ — N junction. This can serve to increase the surface breakdown above the bulk value, provided that the surface is properly passivated in order to minimize the effects of extraneous charge contaminiation. Such passivation is usually a thick (several microns to several mils) coating of an organic material or a glass selected for its high dielectric strength and low ionic conductivity. Such a coating is often applied to individual devices after separation from the main body and thus increases the cost of manufacture over a technique where individual devices with high voltage capabilities may be obtained in wafer form.

Figure 2:
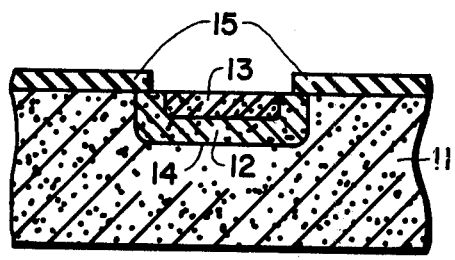
FIG. 2 is a cross-sectional view of another embodiment of a high voltage semiconductor structure.

A technique which is used in order to achieve such individual devices is illustrated in FIG. 2. Here the high voltage junction 14 is formed by the introduction of conductivity modifying impurities through an aperture in a masking layer 15.

Figure 3:
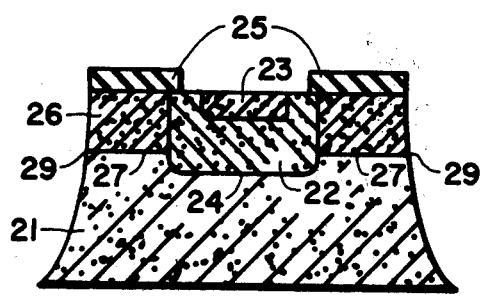
FIG. 3 shows one embodiment of a high voltage semiconductor device according to the present invention.

FIG. 3 shows one embodiment of the present invention. Here 21 is the high resistivity N-type body material, 22 is a P-type region localized for example by an aperture in masking layer 25, and region 26 is a region of limited total doping of opposite conductivity type to that of the body, i.e., region 26 is in this case P-type, and 27 is an auxiliary P-N junction formed by it and the body.

The function of region 26 is explained as follows. Upon application of a small reverse bias between regions 21 and 22, a depletion region develops in the vicinity of junction 24. Because region 26 is connected with region 22, a depletion region also develops in the vicinity of auxiliary junction 27 which is contiguous with the main junction 24. As the reverse bias is increased, the depletion region extends further into both regions 21 and 26 until the latter becomes completely devoid of mobile charge because of its limited total doping. Since region 22 has substantially greater doping than region 26, it does not become fully depleted, but it does become disconnected from the surface terminations 29 of the junction 27 for voltages equal or greater than that voltage required to fully deplete region 26. Since the configuration shown by FIG. 1 usually precludes breakdown to five hundred volts, the structure of FIG. 3 likewise will not breakdown, up to this value. If the doping in layer 26 is adjusted so that full depletion occurs at a voltage below that at which surface breakdown occurs, region 22 can be decoupled from the surface so that bulk breakdown can be more nearly approached than for the configuration of FIG. 1.

Bulk breakdown occurs in silicon for example, when the peak value of electric field reaches a value in excess of about 16 volts per micron; this breakdown is to some extent dependent on resistivity, but for the high resistivity required for breakdown above a few hundred volts a reasonable range is 16 to 32 volts per micron. Thus, in order to fulfill the abovestated requirement that region 26 be completely depleted prior to breakdown of the main junction 24, it is clear that the number of charges per unit area Q in region 26 must be less than that required to terminate a field of 16 volts per micron. From Gauss' law (in 2 dimensions):

$$qQ/\epsilon \leq E_B$$

Here $q$ is the electronic charge, E is the dielectric constant of the semiconductor, and $E_B$ is the minimum electric field in the semiconductor at breakdown. For silicon, $E = 10^{-12}$, $E_B$ is taken as 16 volts per micron so that Q is $10^{12}$ charges per square centimeter. Since each doping atom contributes one electronic charge, a total doping of less than $10^{12}$ atoms per square centimeter will ensure complete depletion of region 26 prior to bulk breakdown. This is true no matter how the doping is distributed in region 26, that is, the volumetric doping density could be either greater or less than that in region 21, or could be graded, as for example, would be the case if region 26 were formed by an in-diffusion from the top surface.

Normal diffusion techniques are probably not well suited to the formation of region 26, because of the poor control over the total doping in the sub-$10^{12}$ atoms per square centimeter range. Ion implantation is perhaps the most controllable method for forming region 26, though it could be formed by epitaxial deposition. From the standpoint of the high voltage breakdown properties of the device, auxiliary junction 27 may be shallower, deeper or the same depth as main junction 24.

Figure 4:
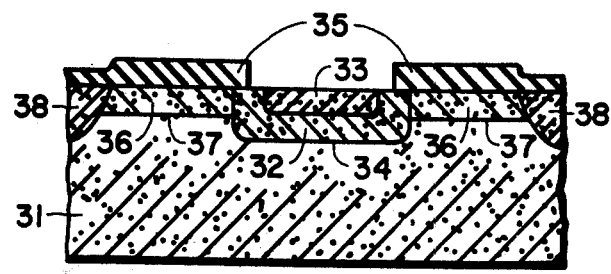
FIG. 4 shows another embodiment of a high voltage semiconductor device according to the present invention.

When many devices of the configuration of FIG. 3 are fabricated side-by-side on a single semiconductor substrate, regions 22 will be connected by region 26 if the latter extends across the entire substrate. Thus, in order to be able to test individual devices before separation, a configuration like that of FIG. 4 may be desirable. In FIG. 4, an additional N-type region 38 surrounds the central P-region 32 at a distance so that the region 36 of limited doping is terminated. Note that the lateral spacing of region 32 and 38 (as well as the spacing of region 22 and the surface termination 29 of the junction 27 in FIG. 3) must be sufficient to maintain the high voltage properties of the device, i.e., at least the desired voltage breakdown divided by the breakdown field strength. In order to avoid distortions of the field in the lateral direction due for example to contamination subsequent to fabrication, it is usually desirable to supply passivating insulation material such as 25 or 35 of sufficient thickness to isolate the semiconductor surface from the ambient. Ideally such thickness should be on the order of the depletion length at breakdown. It is generally easier and more economic to apply such a passivating insulator to the top surface (as in FIG. 3 or 4) of the devices prior to separation than to the lateral surfaces of devices such as depicted in FIG. 1.

Regions 3, 13, 23 and 33 in FIGS. 1-4 respectively, represent additional N-type regions which are the emitters of bipolar transistor structures. Such additional regions are not essential to the functioning of the invention, which could be used in diodes as well as multijunction devices such as transistors and thyristors. While the invention has been illustrated by means of an N-type body and P-type auxiliary regions of limited doping, it should be emphasized that the conductivity types could be reversed without impairing the function of the invention.

What is claimed is:

1. A method for forming a high voltage semiconductor device, comprising:
   providing a high resistivity substrate of one conductivity type and having first and second major surfaces;
   forming a first region of a second opposite conductivity type extending into said substrate from a portion of said first major surface;
   forming a first region of said one conductivity type wholly within said first region and extending from said first major surface;
   forming a second region of said second conductivity type with a total doping less than $10^{12}$ impurity atoms per square centimeter surrounding and abutting said first region of second conductivity type and extending further into said substrate from said first surface than said first region of said one conductivity type.

2. The method of claim 1, further including separating said substrate into a plurality of separate devices having said second region of said second conductivity type extending to the lateral boundaries of said separate device.

3. The method of claim 1, wherein said second region of said second conductivity type is formed by introducing conductivity-determining impurities through essentially all of said first major surface.

4. The method of claim 1, further including forming a second region of said one conductivity type by introducing conductivity-determining impurities through said first major surface into a location surrounding but spaced from said first region of second conductivity type.

* * * * *